(12) United States Patent
Yeh et al.

(10) Patent No.: US 11,328,971 B2
(45) Date of Patent: May 10, 2022

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Shu-Shen Yeh, Taoyuan (TW); Po-Yao Lin, Zhudong Township (TW); Shyue-Ter Leu, Hsinchu (TW); Shin-Puu Jeng, Hsinchu (TW); Chih-Kung Huang, Hsinchu (TW); Tsung-Ming Yeh, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/939,341

(22) Filed: Jul. 27, 2020

(65) Prior Publication Data

US 2020/0357714 A1 Nov. 12, 2020

Related U.S. Application Data

(60) Continuation of application No. 16/166,625, filed on Oct. 22, 2018, now Pat. No. 10,727,147, which is a
(Continued)

(51) Int. Cl.
*H01L 23/34* (2006.01)
*H01L 23/31* (2006.01)
*H01L 23/04* (2006.01)
*H01L 23/367* (2006.01)
*H01L 21/56* (2006.01)
(Continued)

(52) U.S. Cl.
CPC ........ *H01L 23/315* (2013.01); *H01L 21/4817* (2013.01); *H01L 21/4871* (2013.01); *H01L 21/56* (2013.01); *H01L 21/565* (2013.01); *H01L 23/04* (2013.01); *H01L 23/3128* (2013.01); *H01L 23/3142* (2013.01); *H01L 23/367* (2013.01); *H01L 24/16* (2013.01); *H01L 24/32* (2013.01); *H01L 24/73* (2013.01); *H01L 24/92* (2013.01); *H01L 25/18* (2013.01); *H01L 2224/16145* (2013.01); *H01L 2224/16227* (2013.01); *H01L 2224/32245* (2013.01); *H01L 2224/73253* (2013.01); *H01L 2224/92225* (2013.01); *H01L 2225/06513* (2013.01); *H01L 2225/06568* (2013.01); *H01L 2225/06589* (2013.01); *H01L 2924/141* (2013.01); *H01L 2924/143* (2013.01); *H01L 2924/1431* (2013.01); *H01L 2924/1434* (2013.01); *H01L 2924/157* (2013.01); *H01L 2924/1815* (2013.01); *H01L 2924/18161* (2013.01);
(Continued)

(58) Field of Classification Search
CPC ....... H01L 23/315; H01L 23/04; H01L 24/32; H01L 24/92; H01L 2924/18161
USPC ......................... 257/712, 787, 783
See application file for complete search history.

(56) References Cited

U.S. PATENT DOCUMENTS 5,450,283 A 9/1995 Lin et al.
5,471,366 A 11/1995 Ozawa
(Continued)

*Primary Examiner* — Nitin Parekh
(74) *Attorney, Agent, or Firm* — Slater Matsil, LLP

(57) ABSTRACT

A device includes a substrate with a die over the substrate. A molding compound surrounds the die and includes a structural interface formed along a peripheral region of the molding compound.

20 Claims, 4 Drawing Sheets

Related U.S. Application Data division of application No. 15/703,254, filed on Mar. 17, 2016, now Pat. No. 10,109,547.

(60) Provisional application No. 62/288,592, filed on Jan. 29, 2016.

(51) Int. Cl.
 H01L 21/48 (2006.01)
 H01L 23/00 (2006.01)
 H01L 25/18 (2006.01)

(52) U.S. Cl.
 CPC .............. *H01L 2924/3511* (2013.01); *H01L 2924/37001* (2013.01)

(56) References Cited

U.S. PATENT DOCUMENTS

| | | | |
|---|---|---|---|
| 5,726,079 A | 3/1998 | Johnson | |
| 5,773,886 A | 6/1998 | Rostoker et al. | |
| 5,969,947 A | 10/1999 | Johnson et al. | |
| 5,977,626 A * | 11/1999 | Wang | H01L 23/3128 257/691 |
| 6,458,626 B1 | 10/2002 | Huang et al. | |
| 6,933,619 B2 | 8/2005 | Caletka et al. | |
| 7,898,093 B1 * | 3/2011 | Darveaux | H01L 23/562 257/787 |
| 8,710,640 B2 | 4/2014 | Choi et al. | |
| 8,912,051 B1 | 12/2014 | Syed et al. | |
| 10,163,754 B2 | 12/2018 | Ho et al. | |
| 2002/0017738 A1 | 2/2002 | Miyajima | |
| 2003/0168749 A1 | 9/2003 | Koike | |
| 2005/0095875 A1 | 5/2005 | Huang et al. | |
| 2006/0223237 A1 * | 10/2006 | Combs | H01L 21/4871 438/122 |
| 2009/0096115 A1 * | 4/2009 | Huang | H01L 23/3121 257/796 |
| 2010/0096747 A1 * | 4/2010 | Kusano | H01L 23/49816 257/706 |
| 2014/0168902 A1 | 6/2014 | Park et al. | |
| 2014/0264815 A1 | 9/2014 | Yew et al. | |
| 2015/0221625 A1 | 8/2015 | Chun et al. | |
| 2015/0348928 A1 * | 12/2015 | Co | H01L 24/81 257/712 |
| 2016/0035637 A1 | 2/2016 | Urago et al. | |
| 2016/0276308 A1 | 9/2016 | Min et al. | |

* cited by examiner

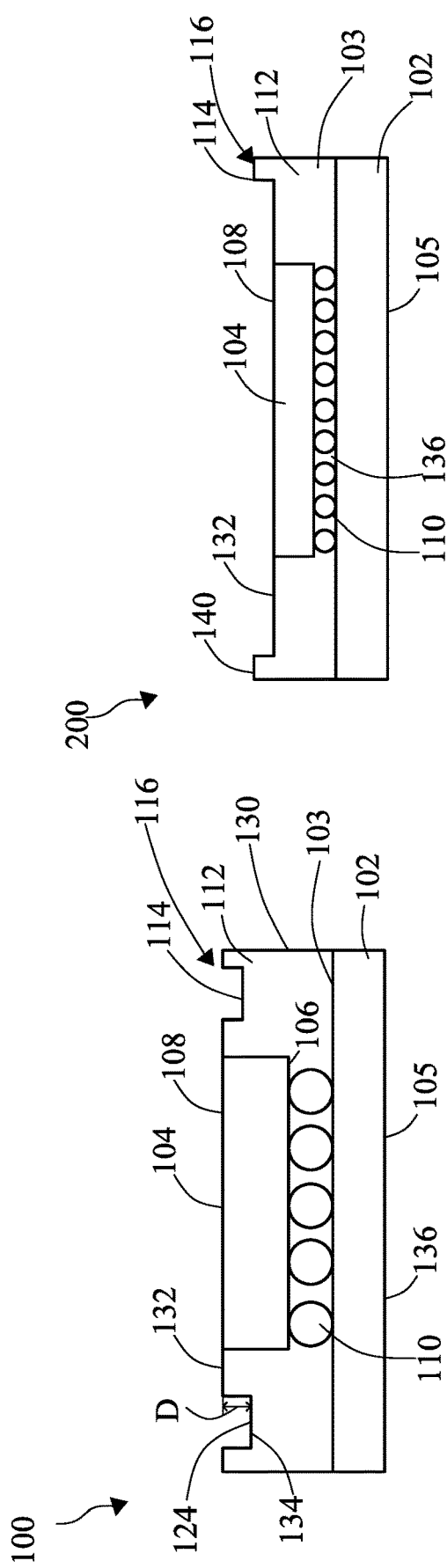
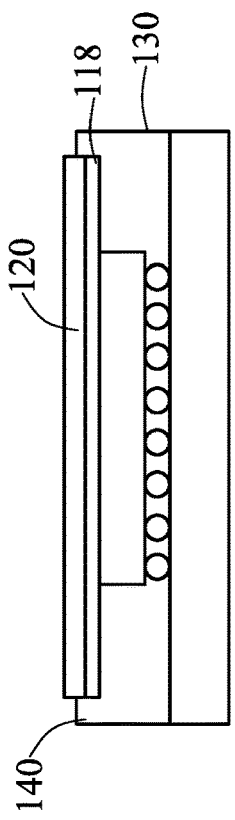
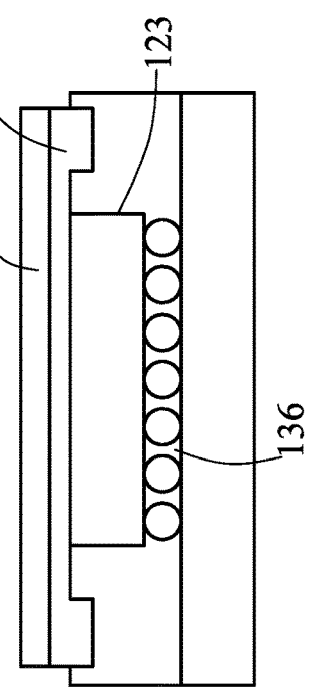
Fig. 1A
Fig. 1B
Fig. 2A
Fig. 2B

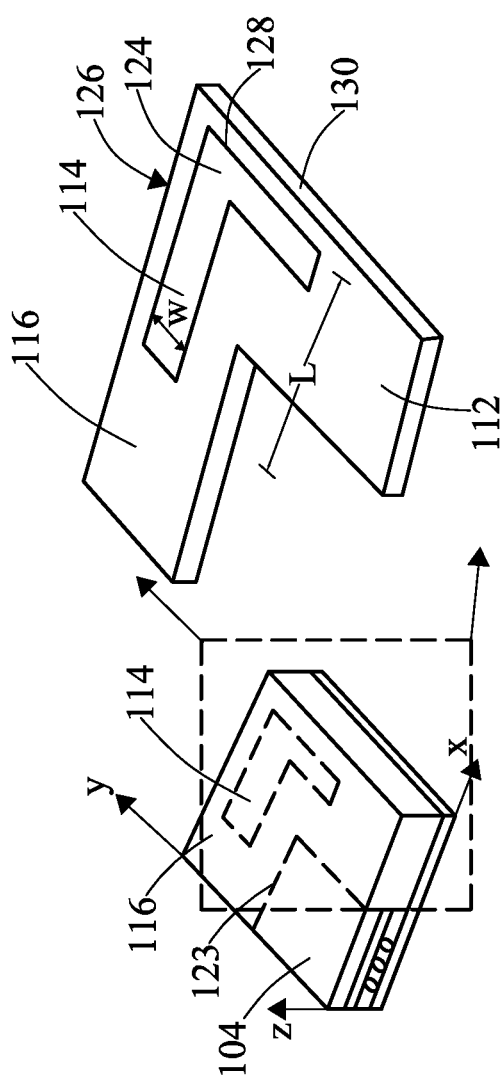
Fig. 1C
Fig. 1D
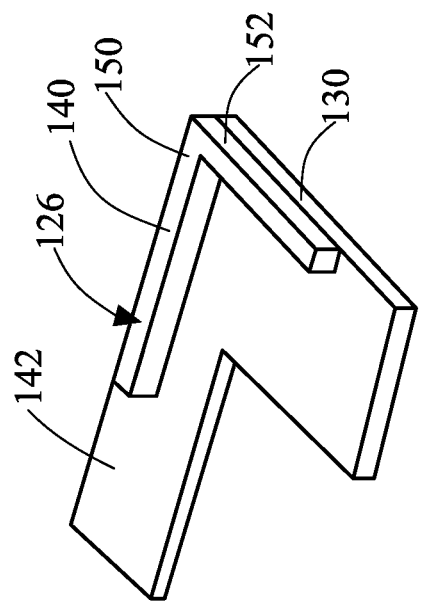
Fig. 2D
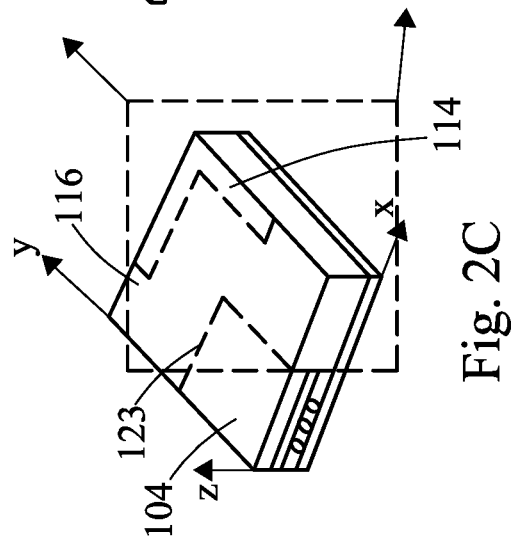
Fig. 2C

SEMICONDUCTOR DEVICE AND METHOD OF MANUFACTURE

PRIORITY CLAIM AND CROSS-REFERENCE

This application is a continuation application of U.S. patent application Ser. No. 16/166,625, filed on Oct. 22, 2018 and entitled "Semiconductor Device and Method of Manufacture," which claims priority to and is a divisional of U.S. patent application Ser. No. 15/073,254, filed on Mar. 17, 2016 (now U.S. Pat. No. 10,109,547, issued on Oct. 23, 2018) and entitled "Semiconductor Device and Method of Manufacture," which claims the benefit of U.S. Provisional Application No. 62/288,592, filed Jan. 29, 2016 and entitled "Semiconductor Device and Method of Manufacture," which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components require smaller and more advanced packaging systems than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. through 1B illustrate various intermediary stages of manufacturing a device, in accordance with some embodiments.

FIG. 1C is a quarter-sectional view of the device illustrated in FIG. 1B shown in an isometric arrangement, in accordance with some embodiments.

FIG. 1D is a detailed, isometric view of a molding compound illustrated in the device of FIG. 1C, in accordance with some embodiments.

FIGS. 2A through 2B illustrate various intermediary stages of manufacturing a device, in accordance with some embodiments.

FIG. 2C is a quarter-sectional view of the device illustrated in FIG. 2B shown in an isometric arrangement, in accordance with some embodiments.

FIG. 2D is a detailed, isometric view of a molding compound illustrated in the device of FIG. 2C, in accordance with some embodiments.

DETAILED DESCRIPTION

Figure 3:
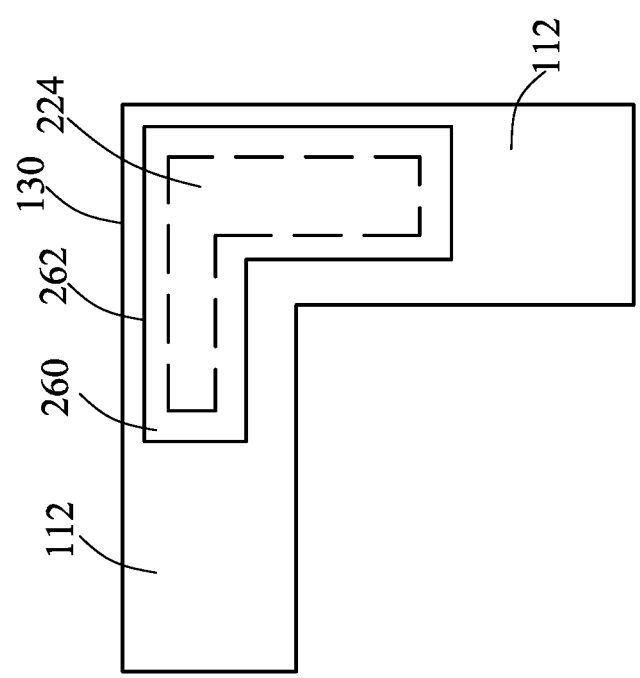
FIG. 3 is a top, quarter-section view of a molding compound, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A through 1D illustrate a semiconductor device or package 100 according to an illustrative embodiment. Referring now primarily to FIGS. 1A and 1B, the semiconductor device 100 is illustrated in cross-section, according to some embodiments, in intermediary stages of manufacturing. The semiconductor device 100 includes a substrate 102 and a device die 104 positioned over the substrate 102.

The substrate 102 may be a semiconductor substrate in some embodiments. The semiconductor substrate may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not shown) such as transistors, capacitors, resistors, diodes, photo-diodes, fuses, and the like may be formed at the top side 103 of the substrate 102. An interconnect structure (not shown) may be formed over the active devices and the substrate 102. The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.0 disposed between such conductive features. In some embodiments, the ILD and IMDs may be made of, for example, phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, formed by any suitable method, such as spinning, CVD, and plasma-enhanced CVD.

The interconnect structure electrically connects various active devices to form functional circuits. The functions provided by such circuits may include memory structures, processing structures, sensors, amplifiers, power distribution, input/output circuitry, or the like. The above examples are provided for illustrative purposes only to further explain applications of the present invention and are not meant to limit the present invention in any manner. Other circuitry may be used as appropriate for a given application.

Input/output (I/O) and passivation features (not separately illustrated) may be formed over the interconnect structure. For example, contact pads may be formed over the interconnect structure and may be electrically connected to the active devices through the various conductive features in the interconnect structure, and a passivation layer may be formed over the interconnect structure and the contact pads. Under bump metallurgies (UBMs) may be formed on such contact pads and connectors (e.g., BGA balls, C4 bumps, microbumps, combinations thereof, and the like) may be formed on the UBMs. Additionally, in embodiments where the device die 104 is a semiconductor die, connectors may be formed on a backside 105 of the substrate 102 (e.g., the side of the substrate 102 opposing a side having active devices formed thereon), and through vias may be formed in the substrate 102 to provide electrical connection between connectors and the interconnect structure of the device die 104.

The device die 104 has a first surface 106 and a second opposing surface 108. The first surface 106 of the device die 104 faces the substrate 102 such that the device die 104 is bonded (e.g., flip chip bonded) to a top side 103 of the substrate 102. In some embodiments, the device die 104 is bonded to contact pads (not shown) on the top side 103 of substrate 102 by a plurality of connectors 110, such as ball grid array (BGA) balls, controlled collapse chip connector (C4) bumps, microbumps, or the like. The device die 104 may be a semiconductor die and could be any type of integrated circuit, such as a processor, logic circuitry, memory, analog circuit, digital circuit, mixed signal, and the like. The device die 104 may include a substrate, active devices, and an interconnect structure (not individually illustrated).

Referring to FIGS. 1A through 1D, the semiconductor device 100 further includes a molding compound 112. The molding compound 112 is over the substrate 102 and surrounds the device die 104. In some embodiments, the molding compound 112 may be a molded underfill (MUF) comprising a polymer material (e.g., epoxy, a resin, and the like) either with or without hardeners, fillers (e.g., silica filler, glass filler, aluminum oxide, silicon oxide, and the like), adhesion promoters, combinations thereof, and the like.

The molding compound 112 may be formed using a suitable process, such as a transfer molding process. The substrate 102 and the device die 104 may be disposed between a top mold chase and a bottom mold chase in a molding apparatus. The top and bottom mold chases may comprise a suitable material for providing structural support/pressure. The top and/or bottom mold may be moved to cover features of the substrate 102 and/or the device die 104 during the molding process, which may prevent the formation of the molding compound 112 over such features of the substrate 102 and/or the device die 104. Protective films may be disposed between the mold chases and contact various features of the substrate 102 and/or device die 104. Protective films protect such features from damage due to contact with top or bottom chases. In some embodiments, protective films comprise rubber, polyethylene terephthalate (PET), teflon, or any other material that can be removed from the substrate 102 and/or the device die 104 after molding.

In another embodiment, the molding compound 112 may be initially formed to cover the device die 104. Next, a planarization step such as a Chemical Mechanical Polish (CMP) step or a grinding step is performed to planarize the molding compound 112 until the device die 104 is exposed. Due to the planarization, the top surface of the device die 104 is substantially level (coplanar) with the top surface of molding compound 112.

Referring still to FIGS. 1A through 1D, the molding compound 112 includes a structural interface 114. FIGS. 1C is a quarter-sectional view of the semiconductor device 100 illustrated in FIG. 1B, shown in an isometric arrangement, with the structural interface 114 shown by hidden lines. FIG. 1D is a detailed, isometric view of FIG. 1C, illustrating the molding compound 112 with the structural interface 114 in accordance with some embodiments. In some aspects, the structural interface 114 is formed along an outer portion or peripheral region 116 of the molding compound 112. The outer portion or peripheral region 116 of the molding compound 112 is distal to an outer edge 123 of the device die 104.

In some aspects, the structural interface 114 is a groove 124 formed in the molding compound 112. In an embodiment, the groove 124 is broken into segments along the outer portion or peripheral region 116 of the molding compound 112. In another embodiment, the groove 124 is positioned in the outer portion or peripheral region 116 of the molding compound 112 but only in one or more corner regions 126 of the molding compound 112. The groove 124 may have a first leg extending along one side of the molding compound 112 and a second leg extending along and adjacent side of the molding compound 112. In some aspects, the first and second legs are perpendicular to each other. In yet some aspects, the groove 124 is L-shaped. In an alternative embodiment, the groove 124 is continuous, e.g., the groove 124 extends along the outer portion or peripheral region 116 of the molding compound 112 without interruption.

In an illustrative embodiment, an outer edge 128 of the groove 124 is approximately 850 micrometers (μm) from an outer edge 130 of the molding compound 112. In another illustrative embodiment, the outer edge 128 of the groove 124 is approximately 300 μm from the outer edge 130 of the molding compound 112. The outer edge 128 of the groove 124 may be approximately 300 μm to 850 μm from the outer edge 130 of the molding compound 112.

In some embodiments, the groove 124 has a width, W, of approximately 1 millimeters (mm). In yet some embodiments, the groove 124 has a width, W, of approximately 1 to 1.5 mm. In some other embodiments, the groove 124 has a length, L, of approximately 4 to 4.5 mm. In an embodiment, the groove 124 has a depth, D, of approximately 50 μm to 150 μm. The depth, D, extends from a topmost surface 132 of the molding compound 112 to a bottommost surface 134 of the groove 124. However, any suitable dimensions may be utilized.

The groove 124 may be formed by a laser ablation process that uses, for example, an EO Laser Ablation-BMC502PI offered by EO Technics Co, Ltd. having a laser power setting of approximately 3.7 W plus or minus 0.3 W. In an embodiment the laser ablation process may be performed by irradiating or ablating the molding compound 112 with a series of laser pulses to form the grooves 124.

In other embodiments, the groove 124 may be formed or patterned using a laser drill or a mold trace. In such a method, a protective layer, such as a light-to-heat conversion (LTHC) layer or a hogomax layer, is first deposited over the molding compound 112. Once protected, a laser is directed towards those portions of the molding compound 112 which are desired to be removed in order to form the groove 124. During the laser drilling process the drill energy may be in a range from 0.1 mJ to about 30 mJ and a drill angle of about 0 degree (perpendicular to the molding compound 112) to about 85 degrees to normal of the molding compound 112.

Referring primarily to FIGS. 1B and 1C, the semiconductor device 100 includes a thermal interface material 118 and may further include a lid 120. The thermal interface material 118 is positioned over the molding compound 112 and the second surface 108 at the device die 104. The thermal interface material 118 is used for thermal interconnection between the lid 120 and the device die 104. In some embodiments, the thermal interface material 118 is used to join the lid 120 to the device die 104. In yet some other embodiments, the thermal interface material 118 is used to join the lid 120 to the molding compound 112. In still some other embodiments, the thermal interface material 118 is used to join the lid 120 to the molding compound 112 and the device die 104.

The lid 120 is placed over and bonded to the device die 104 and/or the molding compound 112. The lid 120 may have a flat top surface. In some embodiments, the lid 120 may be formed of a homogeneous material throughout, which means all the parts of the lid 120 are formed of the same material. In an embodiment, the lid 120 is a metal lid. For example, the lid 120 may be made of copper (Cu) with a thin layer of nickel (Ni), although other metals or metal alloys such as aluminum or aluminum alloys may be used.

The thermal interface material 118 may be selectively deposited. In some embodiments, the thermal interface material 118 is selectively deposited over the device die 104. The thermal interface material 118, in an illustrative embodiment, is deposited over the device die 104 with the quantity of approximately 16 to 28 grams (g). In yet some embodiments, the grooves 124 act to catch excess thermal interface material 118 when the lid 120 is placed on the device die 104.

The thermal interface material 118 has a high thermal conductivity and adheres to both the lid 120 and the device die 104 and/or the molding compound 112. In some embodiments, the thermal interface material 118 is made of silicones, such as polymers including silken, carbon, hydrogen, oxygen and sometimes other elements. Alternatively, the thermal interface material 118 may also be made of other materials such as alumina ($Al_3O_3$) or zinc oxide ($ZnO_2$) mixed with silicone and other applicable materials.

In some embodiments, the thickness, T, of the thermal interface material 118 between the device die 104 and the lid 120 is in a range from about 10 micrometers (μm) to about 300 μm. In some embodiments, the thermal interface material 118 has a thermal conductivity, of between about 3 watts per meter kelvin (W/m.K) to about 5 W/m.K or more. Accordingly, the heat generated in the device die 104 may dissipate to the lid 120, and then dissipate to the external environment. Certain types of device dies generate a large amount of heat during operation. For example, device dies that include central processing unit (CPU), graphical processing unit (GPU), and/or field-programmable gate array (FPGA) tend to generate large amount of heat.

In operation, the chip or device die 104 is positioned over the substrate 102 and includes the connectors 110 to provide electrical connections for the device die 104. The device die 104 and the substrate 102 are placed in a mold. A molding process is performed in which the molding compound 112 is formed above the substrate 102 and around the device die 104. The molding process is operable to position the molding compound 112 in between voids 136, e.g., spaces between the connectors 110, and around the device die 104 to support the device die 104 and provide structural integrity. The substrate 102, the device die 104 and the molding compound 112 form the package structure 122. The package structure 122 is removed from the mold. After the package structure 122 has been removed from the mold the groove 124 is formed in the outer portion or peripheral region 116 of the molding compound 112. The thermal interface material 118 is then applied over the second surface 108 at the device die 104 and at least a portion of the molding compound 112 where the groove 124 is located, such that the thermal interface material 118 fills the groove 124. The lid 120 is then positioned over the thermal interface material 118 and bonded thereto.

The groove 124 helps prevent the thermal interface material 118 from bleeding or otherwise extending past the outer edge 130 of the molding compound 112. Bleeding of the thermal interface material 118 may cause warpage within the semiconductor device 100, which can create issues in yielding and contamination. The groove 124 acts to catch excess thermal interface material 118 when the lid 120 is placed on the device die 104.

Referring now to FIGS. 2A through 2D, a semiconductor device or package 200 according to another illustrative embodiment is presented. Similar to the embodiments described above with respect to FIGS. 1A through 1D, the semiconductor device 200 includes the substrate 102 and the device die 104 positioned over the substrate 102. The device die 104 is bonded to the top side 103 of the substrate 102. The first surface 106 of the device die 104 faces the substrate 102 and the device die 104 is electrically connected to the substrate 102 via the connectors 110.

The semiconductor device 200 further includes the molding compound 112 formed over the substrate 102 and surrounding the device die 104. The molding compound 112 includes the structural interface 114. FIGS. 2C is a quarter-sectional view of the semiconductor device 200 illustrated in FIG. 2B shown in an isometric arrangement, with the structural interface 114 shown by hidden lines. FIG. 2D is a detailed, isometric view of FIG. 2C, illustrating the molding compound 112 with the structural interface 114 in accordance with some embodiments.

In some aspects, the structural interface 114 is formed along the outer portion or peripheral region 116 of the molding compound 112. The outer portion or peripheral region 116 of the molding compound 112 is distal to the outer edge 123 of the device die 104.

In some aspects, the structural interface 114 is a lip or dam 140 extending from a top surface 142 of the molding compound 112 along the outer region or peripheral region 116 of the molding compound 112. In some aspects, the lip or dam 140 extends along the outer edge 130 of the molding compound 112 such that the outer surface of the lip 140 is flush, or otherwise coplanar, with the outer edge 130 of the molding compound 112. In some aspects, the lip 140 is an integral part of the molding compound 112. In an embodiment, the mold is configured such that the lip 140 will be formed during the molding process such that the lip 140 is an integral part of the molding compound 112.

In another aspect, the molding compound 112 is reduced or planarized by, for example, grinding, CMP, etching, or another process to form the lip or dam 140. In some embodiments, the molding compound 112 may be formed to initially extend over and cover top surfaces of device die 104. The planarization process (e.g., a mechanical grinding, chemical mechanical polish (CMP), or other etch back technique) may be employed to remove portions of the molding compound 112 to form the lip or dam 140. In some embodiments, the planarization process (e.g., a mechanical grinding, chemical mechanical polish (CMP), or other etch back technique) may be employed to remove excess portions of the molding compound 112 over the device die 104 to expose the device die.

In an embodiment, the lip 140 extends continuously along the outer edge of the molding compound 112. In an alternative embodiment, the lip 140 is one of a plurality of lips each of which is positioned in the corner region 126 of the molding compound 112. In an embodiment, the lip 140 includes a first leg 150 and a second leg 152. In some embodiments, the lip 140 has a height, h, of between approximately 100 um and 200 um. In some embodiments, the lip 140 has a width, w, of between approximately 300 um and 350 um. And in some embodiments, the lip 140 has a length of between approximately 300 um and 350 um. The lip or dam 140 helps prevent the thermal interface material 118 from extending beyond the outer edge 130 of the molding compound 112.

The semiconductor device 200 further includes the thermal interface material 118 and the lid 120. The thermal interface material 118 is positioned over the molding compound 112 and the device die 104. The thermal interface material 118 joins the lid 120 to one or both of the molding compound 112 and the device die 104.

Referring to FIG. 3, another embodiment illustrating a second groove or a second trench 260 may be formed around the outer edge of a first groove 224, such as the groove 124 shown in FIGS. 1A through 1D, in the molding compound 112. In some embodiments, a perimeter of the first groove 224 is encircled by the second groove or the second trench 260. The second groove 260 may be formed in a separate step than the first groove 224. In one aspect, the second groove 260 is formed before the first groove 224. Yet in another aspect, the second groove 260 is formed after the first groove 224. The second groove 260 may have a depth of approximately 50 μm to 150 μm. In some embodiments, the second groove 260 is formed after the first groove 224 and merely extends the first groove 224 such that the second groove 260 becomes part of the first groove 224. The depth of the first groove 224 and the depth of the second groove 260 may be the same or different so long as the respective depths are between approximately 50 μm to 150 μm. In some aspects, the first groove 224 has a depth greater than the second groove 260. And yet, in alternative aspects, the second groove 260 has a depth greater than the first groove 224. For example, in an embodiment, the first groove 224 has a length, L, of approximately 4 mm, and the second groove 260 has a length of approximately 4 to 4.5 mm. In this embodiment, the first groove 224 may have a width, W, of approximately 1 mm, and the second groove 260 has a width of approximately 1 to 1.5 mm.

In an illustrative embodiment, an outer edge 262 of the second groove 260 is approximately 850 micrometers (μm) from the outer edge 130 of the molding compound 112. In another illustrative embodiment, the outer edge 262 of the second groove 260 is approximately 300 μm from the outer edge 130 of the molding compound 112. The outer edge 262 of the second groove 260 may be approximately 300 μm to 850 μm from the outer edge 130 of the molding compound 112.

Figure 4:
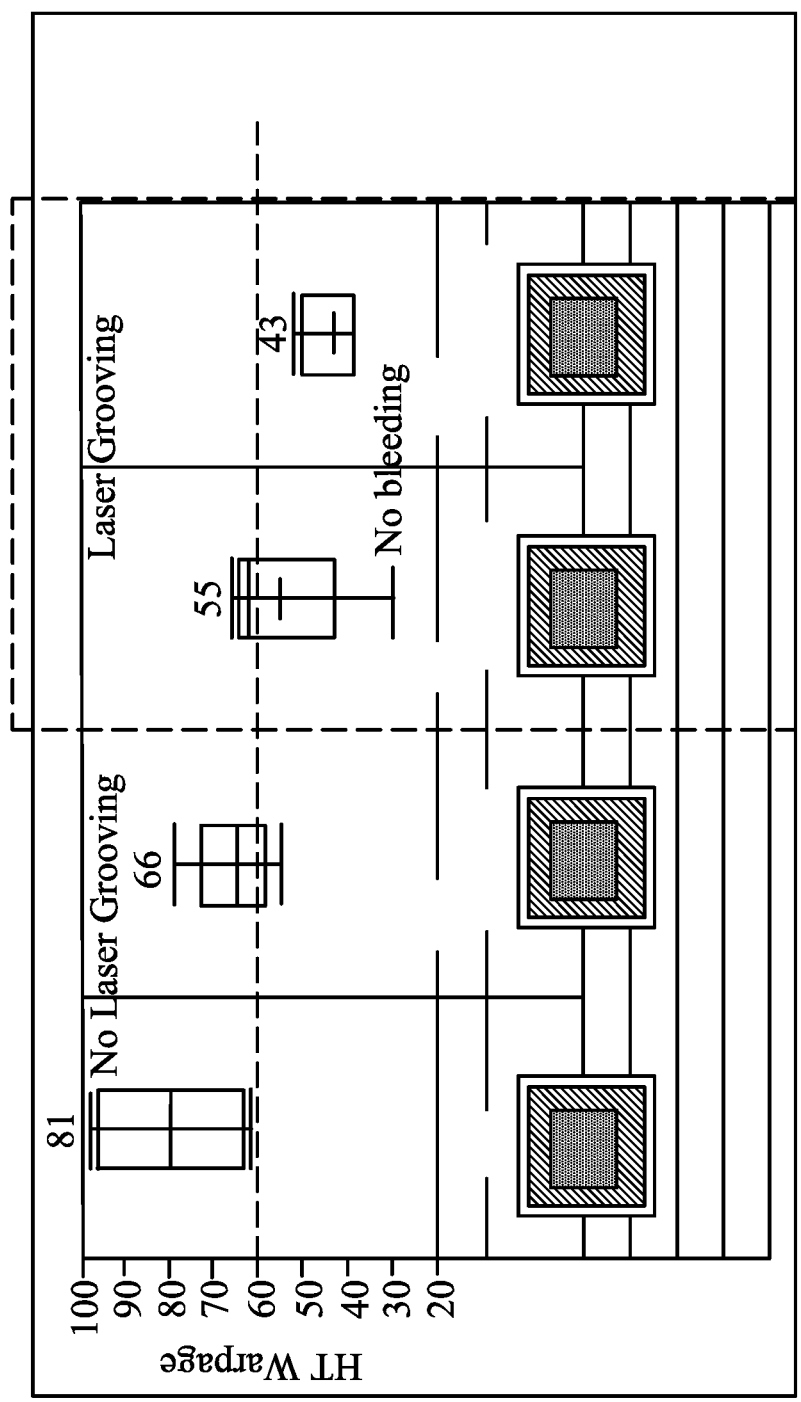
FIG. 4 is a box-plot graph illustrating experimental data.

Referring now to FIG. 4, experimental data is presented via a box-plot type graph. Experiments were conducted on four different packages. Each of the four different packages was subjected according to a high temperature warpage specification. In the high temperature warpage specification, each of the four different packages was heated to 260° C. and then allowed to cool. The amount of warpage, measured in micrometers, was then measured. It is desirable for the package warpage to be under 60 μm.

In experiment 1, the packages tested did not include grooves in the molding compound that surrounded the device die. A thermal interface material was deposited only over the device die such that no thermal interface material was deposited over the molding compound. The median warpage for these type packages was 81 μm, which is above the desired 60 μm threshold.

In experiment 2, the packages tested did not include grooves in the molding compound that surrounded the device die. The thermal interface material was deposited over the device die, the same as was deposited in experiment 1, and, additionally, over portions of the molding compound. The thermal interface material was deposited in an L-shaped over the molding compound in the four corners of the package. The median warpage for these types of packages was 66 μm, which is above the 60 μm threshold.

In experiment 3, the packages tested included a groove formed in the four corners of the package. The groove had two perpendicular legs extending partially along a respective edge of the package. The clearance between the outer edge of the package, which in this case is the outer edge of the molding compound, and an outer edge of the groove was approximately 850 μm. Each leg had a width of approximately 1 mm, a length of approximately 4 mm and a depth of approximately 100 μm. The thermal interface material was deposited over the device die and over each of the grooves in the same manner as it was deposited in experiment 2. The median warpage for these types of packages was 55 μm, which is within the desired 60 μm threshold.

In experiment 4, the packages tested included a groove formed in the four corners of the package. The groove had two perpendicular legs extending partially along a respective edge of the package. The clearance between outer edge of the package, which in this case is the outer edge of the molding compound, and an outer edge of the groove was approximately 300 μm. Each leg had a width of approximately 1 μm, a length of approximately 4 mm and a depth of approximately 100 μm. The thermal interface material was deposited over the device die in over each of the grooves in the same manner as it was deposited in experiments 2 and 3. The median warpage for these types of packages was 43 μm, which is within the desired 60 μm threshold.

It is desirable for a packages warpage to be less than 60 μm as specifications often require the warpage to be less than 60 μm. Additionally, it is also desirable to prevent the thermal interface material, which is sometimes used to combat warpage, from bleeding or otherwise extending beyond the outer edge of the package, which in some instances is the outer edge of the molding compound. Thermal interface material bleeding from package edge can create issues with yielding, contamination and warpage control.

In an embodiment, a device includes a substrate with a die over the substrate. A molding compound surrounds the die and includes a structural interface formed along a peripheral region of the molding compound.

In an embodiment, a device includes a substrate and a chip over the substrate. A molding compound surrounds the chip. The molding compound includes a peripheral region distal to the chip with a groove formed in the peripheral region of the molding compound.

In an embodiment, a method includes the steps of positioning a die over a substrate, forming a molding compound around the die, and forming a groove in a peripheral region of the molding compound.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a chip over a substrate; and
a molding compound surrounding the chip, the molding compound comprising a first lip in a peripheral region distal the chip, the molding compound comprising a vertical sidewall including an outer sidewall of the first lip, the firt lip comprising a first inner sidewall and a second inner sidewall adjacent the first inner sidewall, the first inner sidewall and the second inner sidewall being outside a periphery of the chip, wherein the first lip is L-shaped in a top-down view, and wherein the first lip is disposed at a corner of the molding compound; and
a thermal interface material extending from the first inner sidewall to the second inner sidewall, wherein the molding compound encircles the thermal interface material.

2. The device of claim 1, wherein a top surface of the thermal interface material is below a top surface of the first lip in a direction perpendicular to a major surface of the substrate.

3. The device of claim 1, further comprising a lid attached to the chip and the molding compound by way of the thermal interface material.

4. The device of claim 3, wherein the lid extends from the first inner sidewall to the second inner sidewall of the first lip.

5. The device of claim 1, wherein the chip is bonded to the substrate by a plurality of connectors, wherein the molding compound extends between adjacent connectors of the plurality of connectors.

6. A device comprising:
a substrate;
an integrated circuit chip mounted to the substrate;
a molding compound encapsulating at least sidewalls of the integrated circuit chip, the molding compound including a lip at an uppermost surface of the molding compound, the lip surrounding a peripheral portion of the integrated circuit chip;
an interface material overlying a topmost surface of the molding compound, wherein the interface material comprises a single continuous material extending between opposite innermost sidewalls of the lip; and
a lid joined to the integrated circuit chip by way of the interface material, wherein the interface material contacts the lid and the integrated circuit chip, wherein an outer edge of the lip is disposed outside of an outer edge of the lid.

7. A device comprising:
a die over a substrate;
a molding compound surrounding the die, the molding compound having a lip formed along a peripheral region of the molding compound, the lip including a first innermost sidewall that is outside an outermost periphery of the die and a first outermost sidewall that is continuous with a first outermost sidewall of the molding compound, wherein the molding compound has a first width measured between the first outermost sidewall of the molding compound and a second outermost sidewall of the molding compound opposite the first outermost sidewall of the molding compound; wherein the first innermost sidewall of the lip, the first outermost sidewall of the lip, the first outermost sidewall of the molding compound, and the second outermost sidewall of the molding compound are vertical in a direction perpendicular to a major surface of the substrate; and
an interface material over the die and the molding compound, wherein the interface material is adjacent the lip, wherein the interface material has a second width measured between a first outermost sidewall of the interface material and a second outermost sidewall of the interface material opposite the first outermost sidewall of the interface material, wherein the second width is measured in a direction parallel to a direction in which the first width is measured, and wherein the first width is greater than the second width.

8. The device of claim 7, wherein the interface material extends from the first innermost sidewall of the lip to a second innermost sidewall of the lip opposite the first innermost sidewall of the lip.

9. The device of claim 7, further comprising a lid attached to the interface material.

10. The device of claim 9, wherein the lid has a third width measured between a first outermost sidewall of the lid and a second outermost sidewall of the lid opposite the first outermost sidewall of the lid, wherein the third width is measured in a direction parallel to the direction in which the first width and the second width are measured, wherein the third width is equal to the second width.

11. The device of claim 7, wherein the lip is L-shaped and is disposed at a corner of the molding compound.

12. The device of claim 7, wherein the lip is continuous and encircles the interface material.

13. The device of claim 7, wherein the interface material is in physical contact with the molding compound and the die.

14. The device of claim 7, wherein the lip has a width from 300 micrometers to 350 micrometers.

15. The device of claim 6, wherein the integrated circuit chip is mounted to the substrate using a plurality of connectors, wherein the molding compound extends between the integrated circuit chip and the substrate.

16. The device of claim 15, wherein the molding compound extends between adjacent connectors of the plurality of connectors.

17. The device of claim 6, wherein a width of the interface material between the opposite innermost sidewalls of the lip is equal to a distance between the opposite innermost sidewalls of the lip.

18. The device of claim 17, wherein a width of the lid is equal to the width of the interface material and the distance between the opposite innermost sidewalls of the lip.

19. The device of claim 6, wherein the lid contacts the opposite innermost sidewalls of the lip.

20. The device of claim 1, wherein the molding compound includes a second lip, a third lip, and a fourth lip, and wherein the first lip, the second lip, the third lip, and the fourth lip encircle the thermal interface material.

\* \* \* \* \*